United States Patent
Yang et al.

(10) Patent No.: US 9,190,586 B2
(45) Date of Patent: Nov. 17, 2015

(54) SEMICONDUCTOR LIGHT-EMITTING DEVICE

(71) Applicant: PHOSTEK, INC., Hsinchu (TW)

(72) Inventors: Shih Tsun Yang, Hsinchu County (TW); Yuan-Hsiao Chang, Taipei (TW); Jhih-Sin Hong, Taichung (TW)

(73) Assignee: PHOSTEK, INC., Hsinchu (TW)

( * ) Notice: Subject to any disclaimer, the term of this patent is extended or adjusted under 35 U.S.C. 154(b) by 371 days.

(21) Appl. No.: 13/862,191

(22) Filed: Apr. 12, 2013

(65) Prior Publication Data

US 2014/0055048 A1    Feb. 27, 2014

Related U.S. Application Data

(60) Provisional application No. 61/692,123, filed on Aug. 22, 2012.

(51) Int. Cl.
*H05B 33/08* (2006.01)
*H01L 33/62* (2010.01)
*H01L 25/075* (2006.01)

(52) U.S. Cl.
CPC .............. *H01L 33/62* (2013.01); *H01L 25/075* (2013.01); *H05B 33/0806* (2013.01); *H01L 2924/0002* (2013.01)

(58) Field of Classification Search
USPC ...................... 315/192; 257/79–103
See application file for complete search history.

(56) References Cited

U.S. PATENT DOCUMENTS

2009/0109151 A1\* 4/2009 Kim et al. .................... 345/83
2013/0087814 A1\* 4/2013 Moon et al. .................. 257/88

\* cited by examiner

*Primary Examiner* — Douglas W Owens
*Assistant Examiner* — Jonathan Cooper
(74) *Attorney, Agent, or Firm* — Huffman Law Group, PC (57) ABSTRACT

A semiconductor light-emitting device includes at least one light-emitting chip. The light-emitting chip includes plural light-emitting units, which are electrically coupled to each other in series, in parallel or in series-parallel combination; a first-type electrode electrically coupled to an external power source, the first-type electrode being disposed on one of the light-emitting units; a second-type electrode disposed on another of the light-emitting units; and a tapped point for electrically coupling at least one of the light-emitting units to an electronic component.

18 Claims, 8 Drawing Sheets

SEMICONDUCTOR LIGHT-EMITTING DEVICE

BACKGROUND OF THE INVENTION

1. Field of the Invention

The present invention generally relates to a semiconductor light-emitting device, and more particularly to a light-emitting chip with a tapped point.

2. Description of Related Art

A conventional light-emitting diode (LED) device is packaged by disposing multiple LED chips on a circuit board. Specifically, the LED chips are first connected in series or parallel by interconnecting lines. After bonding to the circuit board, the LED chips are connected to a positive point and a negative point of an input voltage of the circuit board.

The series-connected LED chips are commonly connected to a driving module by conductive lines. According to charge-discharge characteristics of capacitors of the driving module, however, the conventional LED devices have low operating efficiency.

A need has thus arisen to propose a novel LED device with LED chips connected in series or parallel that has enhanced operating efficiency when being connected to a driving module.

SUMMARY OF THE INVENTION

In view of the foregoing, it is an object of the embodiment of the present invention to provide a semiconductor light-emitting device having light-emitting chips with at least one tapped point for coupling to an electronic component. The entire operating efficiency of the semiconductor light-emitting device may be enhanced by adjusting a position of the tapped point within the semiconductor light-emitting device with respect to various configurations of the light-emitting chips connected in series or parallel.

According to one embodiment, a semiconductor light-emitting device includes at least one light-emitting chip. The light-emitting chip includes plural light-emitting units, a first-type electrode, a second-type electrode and a tapped point. The light-emitting units are electrically coupled to each other in series, in parallel or in series-parallel combination. The first-type electrode is electrically coupled to an external power source and is disposed on at least one of the light-emitting units. The second-type electrode is disposed on at least another one light-emitting unit different from the one light-emitting unit on which the first-type electrode is disposed. The tapped point is configured for electrically coupling at least one of the light-emitting units to an electronic component.

According to another embodiment, a semiconductor light-emitting device includes plural light-emitting chips, a first-type electrode, a second-type electrode and a tapped point. The light-emitting chips are electrically coupled to each other in series, in parallel or in series-parallel combination. The first-type electrode is electrically coupled to an external power source and is disposed on at least one light-emitting chip. The second-type electrode is disposed on at least another one light-emitting chip different from the at least one light-emitting chip, on which the first-type electrode is disposed. The tapped point is disposed on at least one light-emitting chip or between two adjacent light-emitting chips, and the tapped point is configured for electrically coupling to an electronic component.

DETAILED DESCRIPTION OF THE INVENTION

Figure 1A:
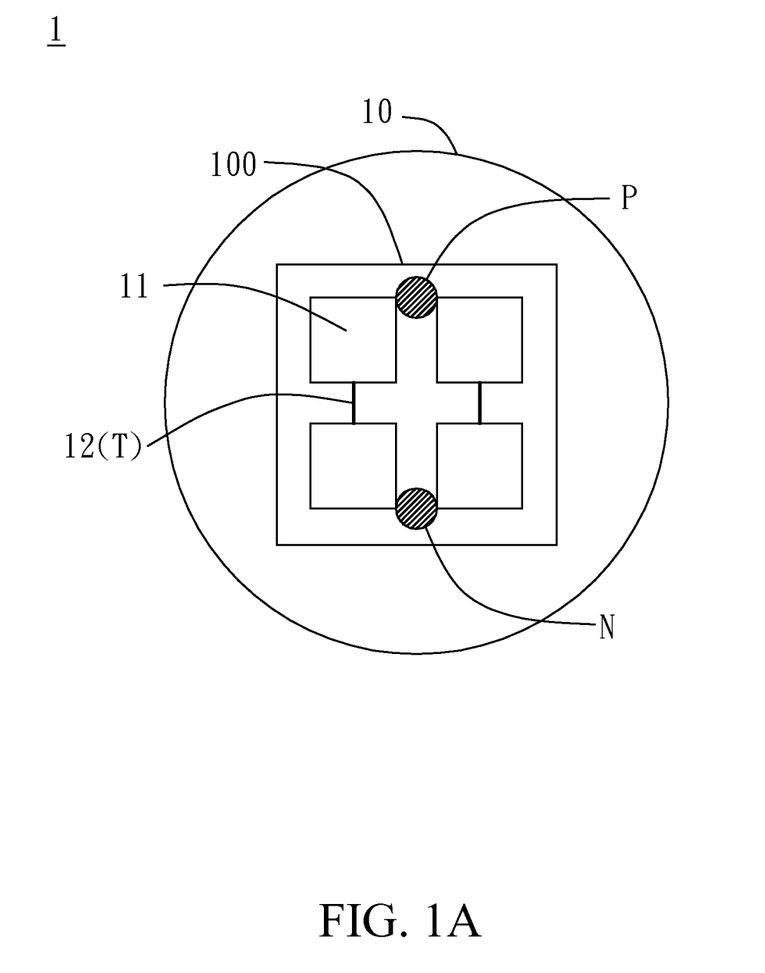
FIG. 1A shows a top view of a semiconductor light-emitting device according to one embodiment of the present invention.
Figure 1B:
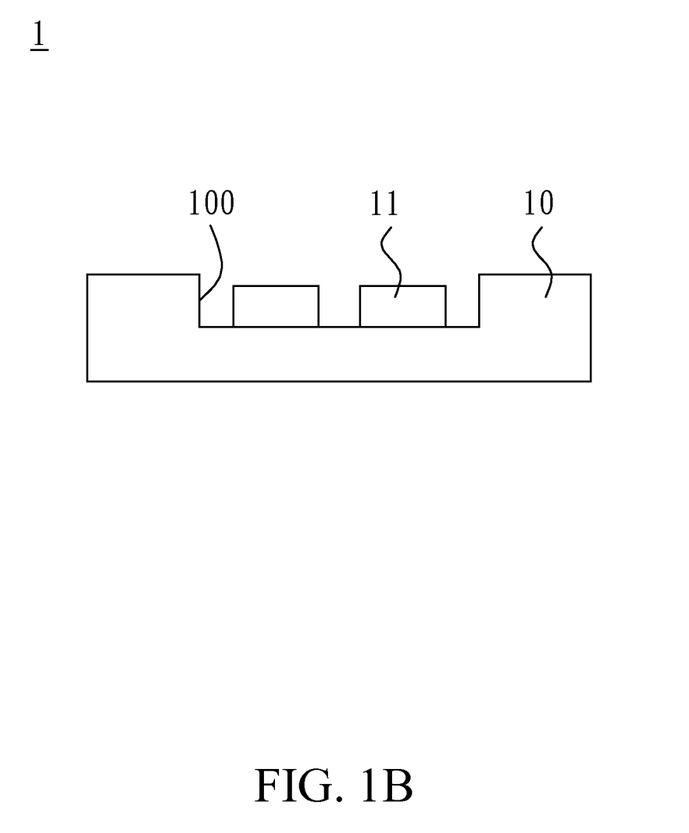
FIG. 1B show a side view of FIG. 1A.

FIG. 1A shows a top view of a semiconductor light-emitting device 1 according to one embodiment of the present invention, and FIG. 1B show a side view of FIG. 1A. The semiconductor light-emitting device 1 of the embodiment includes a circuit board 10 with a die bonding area 100. At least one light-emitting chip 11 (four light-emitting chips 11 are exemplified in FIG. 1A), such as a light-emitting diode (LED) chip, may be bonded on a surface of the die bonding area 100. When multiple light-emitting chips 11 are included in the semiconductor light-emitting device 1, the light-emitting chips 11 may be connected in series, in parallel or in series-parallel combination by metal lines 12, and be adaptable to requirements of different input voltage and/or luminous flux (e.g., in a unit of lumen).

The process for forming the light-emitting chip 11 need not be restricted to a mesa process, and the light-emitting chip 11 may be a large-size or an independent package instead. The light-emitting chip 11 may include group III nitride epitaxially formed on a sapphire ($Al_2O_3$) substrate, resulting in LEDs. The group III nitride may include indium nitride (InN), gallium nitride (GaN), aluminum nitride (AlN), indium gallium nitride (InGaN) or indium aluminum gallium nitride (InAlGaN). In one embodiment, the light-emitting chip 11 may further include LEDs having aluminum gallium indium phosphide (AlGaInP) formed on a gallium phosphide (GaP) substrate; indium gallium arsenide (InGaAs) formed on a gallium arsenide (GaAs) substrate; aluminum gallium arsenide (AlGaAs) formed on a gallium arsenide (GaAs) substrate; or silicon carbide (SiC) formed on a silicon carbide (SiC) or sapphire substrate. The light-emitting chip 11 may include LEDs having group III-V material epitaxially formed on gallium arsenide (GaAs), silicon germanium (SiGe) formed on germanium (Ge), silicon carbide (SiC) formed on silicon (Si), aluminum oxide ($Al_3O_2$) formed on aluminum (Al), gallium nitride (GaN), indium nitride (InN), zinc oxide (ZnO), aluminum nitride (AlN), sapphire, glass, quartz or their combination. Alternatively, the light-emitting chip 11 may include LEDs having group II-VI material epitaxially formed on a substrate. The substrates mentioned above may be removed from a final LED package.

The semiconductor light-emitting device 1 may also include a first-type electrode P, a second-type electrode N and a tapped point T. The first-type electrode P, disposed on one of the light-emitting chips 11, may be electrically coupled to an external power source. The second-type electrode N may be disposed on one light-emitting chip 11 different from the one on which the first-type electrode P is disposed. The tapped point T, configured for electrically coupling to an electronic component (not shown), may be disposed on one light-emitting chip 11 or disposed between two adjacent light-emitting chips 11. In one embodiment, the second-type electrode N is electrically coupled to the electronic component at a point that is different from another point at which the tapped point T is electrically coupled to the electronic component.

Figure 2:
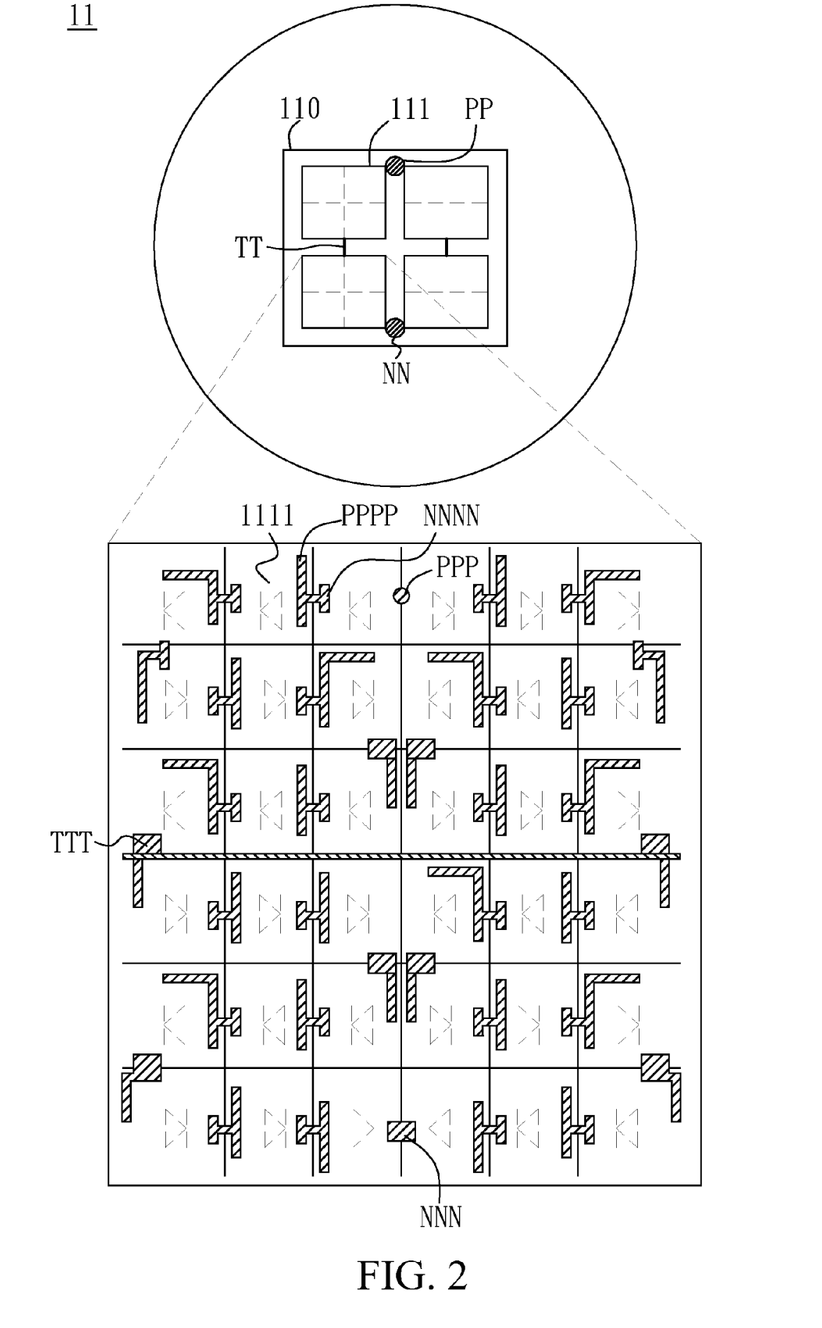
FIG. 2 illustrates a detailed top view of the light-emitting chip of FIG. 1A/1B.

In the embodiment, as shown in FIG. 2 that illustrates a top view of the light-emitting chip 11 of FIG. 1A/1B, the light-emitting chip 11 may include a substrate 110 and plural light-emitting units 111 (four light-emitting units 111 are exemplified in FIG. 2) bonded on the substrate 110. The light-emitting units 111 may be connected in series, in parallel or in series-parallel combination by metal lines. In one embodiment, any two or more of the the light-emitting chips 11 may be stacked, for example, by epitaxy stacking or bonding stacking.

FIG. 2 also illustrates a detailed amplified view of the light-emitting unit 111, which may include plural light-emitting sub-units 1111 (each light-emitting unit 111 includes nine light-emitting sub-units 1111 so thirty-six light-emitting sub-units 1111 are exemplified in FIG. 2). The light-emitting sub-units 1111 may be connected in series, in parallel or in series-parallel combination by metal lines. The light-emitting sub-unit 1111 may, but not necessarily, be a mesa structure. Each light-emitting unit 111 may include plural light-emitting sub-units 1111, which are stacked, for example, by epitaxy stacking or bonding stacking.

Figure 3:
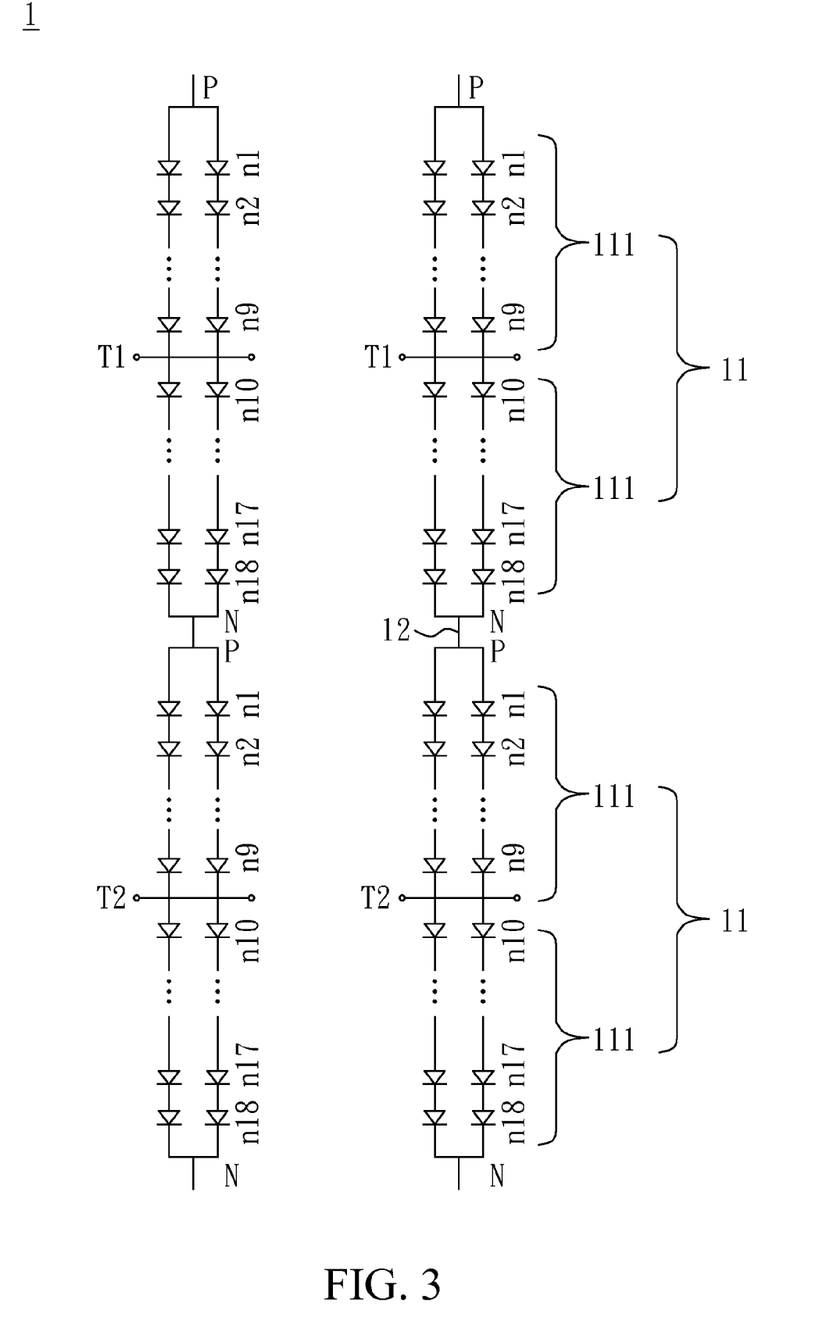
FIG. 3 shows a circuit diagram of the semiconductor light-emitting device of FIG. 1A/1B and FIG. 2.

FIG. 3 shows a circuit diagram of the semiconductor light-emitting device 1 of FIG. 1A/1B and FIG. 2. Assume that the operating voltage of the light-emitting sub-unit 1111 is about 3 volts, the operating voltage of nine light-emitting sub-units 1111 (n1, n2 ... n9) connected in series is thus about 28 volts. As exemplified in FIG. 3, the light-emitting unit 111 is comprised of two parallel sets of nine light-emitting sub-units 1111, and the light-emitting chip 11 is comprised of two serial light-emitting units 111, resulting in an operating voltage of about 56 volts. The semiconductor light-emitting device 1 is comprised of two serial light-emitting chips 11, resulting in an operating voltage of about 110 volts.

Referring to FIG. 2, the light-emitting chip 11 may also include a first-type electrode PP (for example, a P-type electrode) configured for electrically coupling to an external power source (not shown). The first-type electrode PP may be disposed on at least one light-emitting unit 111. As exemplified in FIG. 2, the first-type electrode PP is disposed between two adjacent light-emitting units 111. Similarly, the light-emitting chip 11 may also include a second-type electrode NN (for example, an N-type electrode) that may be disposed on at least one light-emitting unit 111 different from the one, on which the first-type electrode PP is disposed. As exemplified in FIG. 2, the second-type electrode NN is disposed between two adjacent light-emitting units 111.

The P-type electrode mentioned above may include nickel (Ni), platinum (Pt), silver (Ag), indium tin oxide (ITO) or their combination (such as Ni/Ag, Ni/Pt/Ag or ITO/Ag). The N-type electrode mentioned above may include titanium (Ti), aluminum (Al), chromium (Cr), platinum (Pt), aurum (Au) or their combination (such as Cr/Pt/Au, Ti/Al/Pt/Au or Ti/Pt/Au.

According to one aspect of the embodiment, as shown in FIG. 2, the light-emitting chip 11 may include at least one tapped point TT configured for electrically coupling at least one light-emitting unit 111 to an electronic component. Accordingly, in addition to the first-type electrode PP and the second-type electrode NN, the light-emitting chip 11 has the tapped point TT as a third-type electrode. The tapped point TT may be disposed on at least one light-emitting unit 111 different from the one, on which the first-type electrode PP and the second-type electrode NN are disposed. Alternatively, the tapped point TT may be disposed on the substrate 110, be disposed between two adjacent light-emitting units 111, at least one of which being electrically coupled to the tapped point TT. In the embodiment, the second-type electrode NN is electrically coupled to the electronic component at a point that is different from another point, at which the tapped point TT is electrically coupled to the electronic component. Although the tapped point TT exemplified in FIG. 2 is disposed inside the light-emitting chip 11, the tapped point TT may be disposed on the circuit board 10 and external to the light-emitting chip 11.

In the embodiment, the tapped point TT, configured for an external electrical coupling, may disposed on the electrode of at least one light-emitting unit 111, and may be made by expanding the N/P type sub-electrode (i.e., NNNN/PPPP) of the light-emitting sub-unit 1111. For example, the tapped point TT may be made by expanding the length and width of the N/P type sub-electrode (i.e., NNNN/PPPP) to result in a two-dimensional sheet structure, or further expanding the height of the N/P type sub-electrode (i.e., NNNN/PPPP) to result in a three-dimensional cylindrical structure or ball structure (e.g., solder ball). The tapped point TT may be electrically coupled to an electronic component directly by metal lines; or by electrically coupling the cylindrical structure or the ball structure to the electronic component in a flip chip manner; or by aligning the cylindrical structure or the ball structure with a reserved position of the electronic component in a chip-on-board (COB) manner. The tapped point TT mentioned above may include metallic material.

As exemplified in FIG. 3, a tapped point T1/T2 may be disposed on a first-type sub-electrode (e.g., a P-type electrode) of a light-emitting sub-unit 1111 (e.g., n10) and a second-type sub-electrode (e.g., an N-type electrode) of an adjacent light-emitting sub-unit 1111 (e.g., n9). Generally speaking, the tapped point T1/T2 may be disposed on any combination of sub-electrodes of the adjacent light-emitting sub-units 1111. In other words, for example, the first-type sub-electrode may be electrically coupled to the second-type sub-electrode, the first-type sub-electrode may be electrically coupled to the first-type sub-electrode, or the second-type sub-electrode may be electrically coupled to the second-type sub-electrode.

Figure 4:
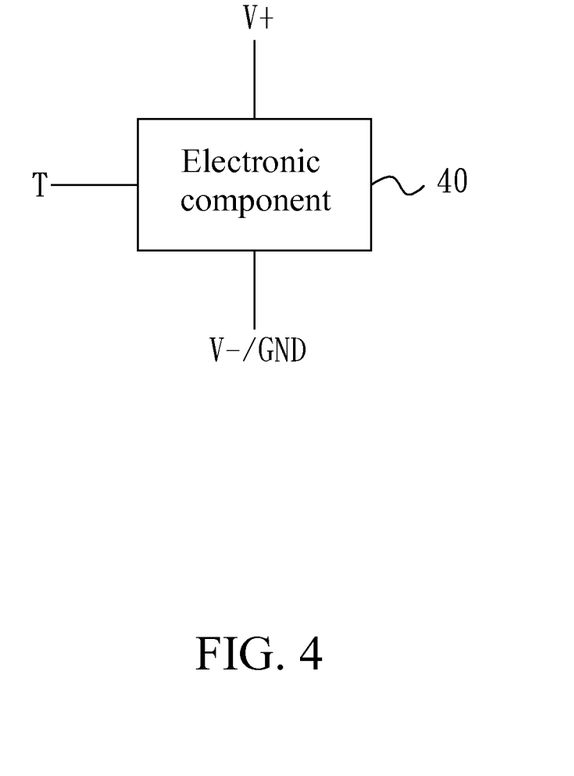
FIG. 4 shows a schematic diagram illustrative of relationship among an electronic component, a tapped point, and a power source with a first point V+ and a second point V−.

FIG. 4 shows a schematic diagram illustrative of relationship among an electronic component 40, a tapped point T, a power with a first point V+ and a second point V−, and ground GND. The electronic component 40 may be an integrated circuit (IC) (e.g., a constant current driver IC), printed electronics or a passive component (e.g., a current regulative diode or a resistor).

Figure 5A:
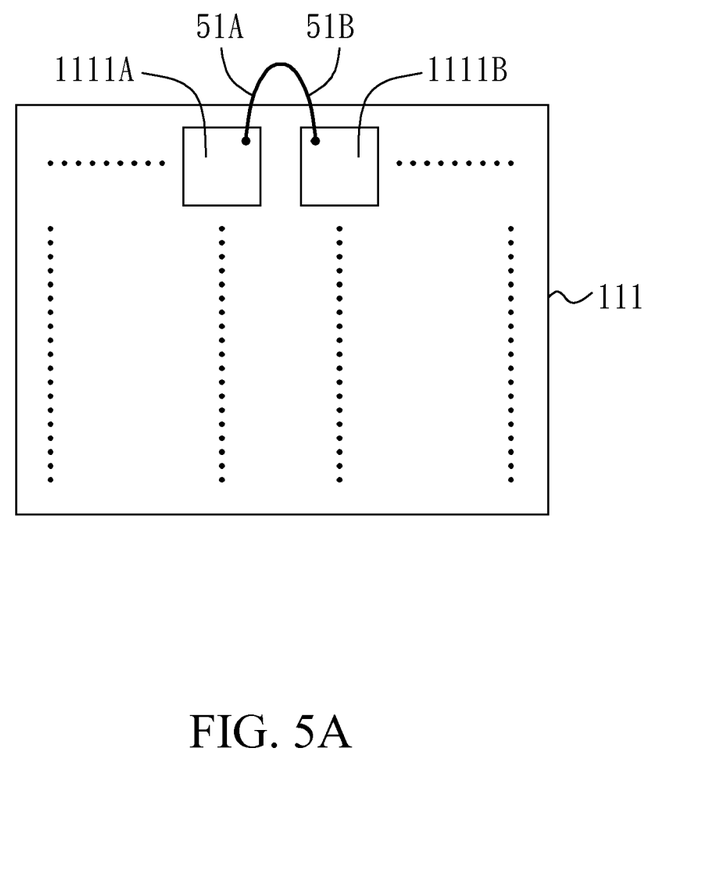
FIG. 5A and FIG. 5B show configurations of the tapped point of FIG. 2.
Figure 5B:
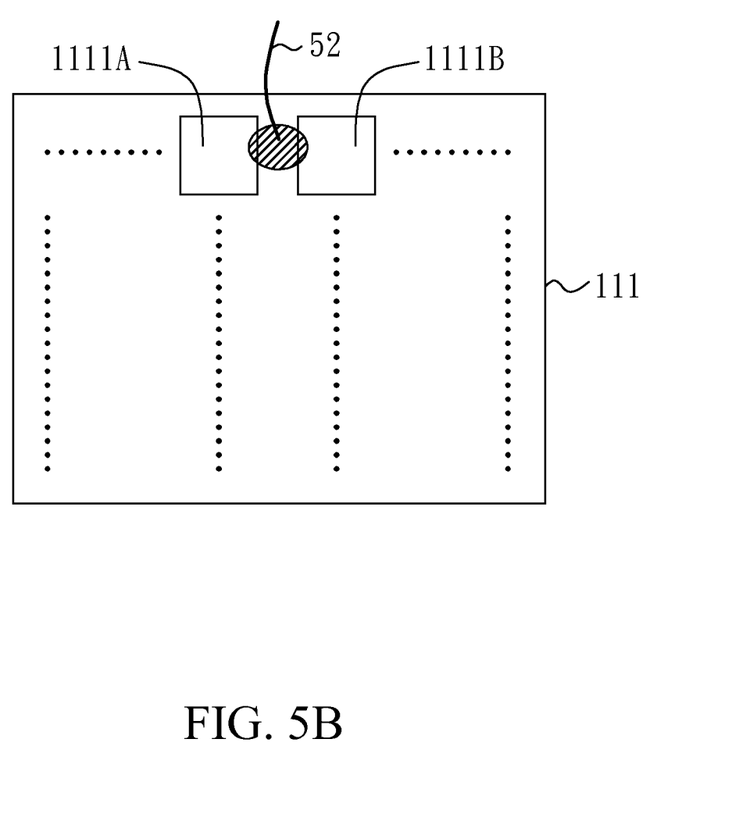

FIG. 5A and FIG. 5B show configurations of the tapped point TTT of FIG. 2. In FIG. 5A, a (first/second type) sub-electrode of a light-emitting sub-unit 1111A and a (first/second type) sub-electrode of an light-emitting sub-unit 1111B near the light-emitting sub-unit 1111A are connected externally by metal lines 51A and 51B, respectively, therefore resulting in a tapped point TTT. In FIG. 5B, a (first/second type) sub-electrode of a light-emitting sub-unit 1111A and a (first/second type) sub-electrode of an light-emitting sub-unit 1111B near the light-emitting sub-unit 1111A are electrically coupled to each other inside the light-emitting chip 11, therefore resulting in a tapped point TTT, and then connected to outside the light-emitting chip 11 by a metal line 52.

Figure 6:
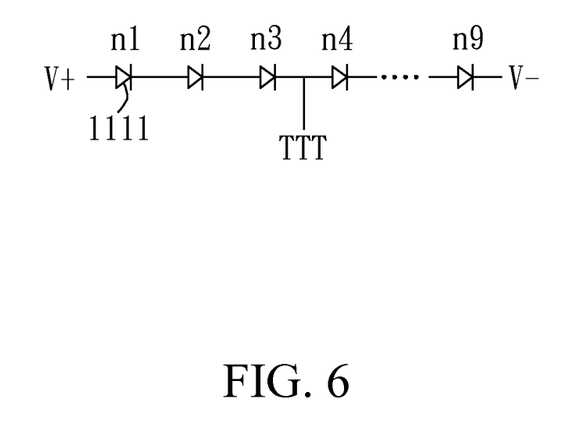
FIG. 6 shows series-connected light-emitting sub-units with a tapped point disposed therebetween.

According to another aspect of the embodiment, the tapped point TTT may be disposed at a position of $1/10$th to $2/5$th, and preferably $1/3$rd, of the series-connected light-emitting sub-units 1111 that are connected to an external power source. FIG. 6 shows nine series-connected light-emitting sub-units 1111 with a tapped point TTT disposed between n3 and n4, that is, at ⅓ of the series-connected light-emitting sub-units 1111. The rationale of disposing the tapped point at ⅓ of the light-emitting sub-units 1111 is as follows. It is assumed that the semiconductor light-emitting device 1 has an operating voltage of 110 volts and is operated under an alternating current (AC) voltage (e.g., an input voltage between −150 and 150 volts). By using the tapped point disposed at ⅓, surplus voltage may be stored in a capacitor (as the electronic component) when the input voltage is greater than 110 volts; and the stored voltage or energy may then be released to the semiconductor light-emitting device 1 when the input voltage is less than 110 volts. Accordingly, lighting of the semiconductor light-emitting device 1 can be kept consistent, therefore enhancing operating efficiency.

As exemplified in FIG. 3, the tapped point T1 or T2 is disposed at ¼ (i.e., 9/36) of the (thirty-six) series-connected light-emitting sub-units 1111. It is noted that the light-emitting chip of the conventional semiconductor light-emitting device does not have a tapped point for connecting to an electronic component. As a result, only an intermediate point between series-connected adjacent light-emitting chips can be used as a tapped point to be connected to an electronic component, therefore resulting in ½ tapping that has substantively lower operating efficiency than that shown in FIG. 3.

Although specific embodiments have been illustrated and described, it will be appreciated by those skilled in the art that various modifications may be made without departing from the scope of the present invention, which is intended to be limited solely by the appended claims.

What is claimed is:

1. A semiconductor light-emitting device comprising at least one light-emitting chip, the light-emitting chip comprising:
    a plurality of light-emitting units electrically coupled to each other in series, in parallel or in series-parallel combination;
    a first-type electrode electrically coupled to an external power source, the first-type electrode being disposed on at least one of the light-emitting units;
    a second-type electrode disposed on at least another one of the light-emitting units different from the at least one of the light-emitting units, on which the first-type electrode is disposed; and
    a tapped point configured for electrically coupling at least one of the light-emitting units to an electronic component selected from the group consisting of an integrated circuit, a printed electronic component, and a passive component other than a light-emitting diode;
    wherein the tapped point is disposed on at least another one of the light-emitting units different from the light-emitting units on which the first-type electrode and the second-type electrode are disposed; and
    wherein the second-type electrode is electrically coupled to the electronic component at a point that is different from another point at which the tapped point is electrically coupled to the electronic component.

2. The semiconductor light-emitting device of claim 1, wherein the tapped point is disposed on at least one of the light-emitting units, the tapped point having a sheet structure, a cylindrical structure or a ball structure.

3. The semiconductor light-emitting device of claim 1, wherein the tapped point is electrically coupled to the electronic component directly by a metal line.

4. The semiconductor light-emitting device of claim 2, wherein the tapped point is electrically coupled to the electronic component via the sheet structure, cylindrical structure or the ball structure in flip chip and/or chip-on-board (COB) manner.

5. The semiconductor light-emitting device of claim 1, further comprising a substrate on which the light-emitting units are bonded.

6. The semiconductor light-emitting device of claim 5, wherein the tapped point is disposed on the substrate and between two of the adjacent light-emitting units, the tapped point being electrically coupled to at least one of the two adjacent light-emitting units.

7. The semiconductor light-emitting device of claim 1 comprising a plurality of the light-emitting chips, which are electrically coupled to each other in series, in parallel or in series-parallel combination.

8. The semiconductor light-emitting device of claim 1, wherein any two or more of the at least one light-emitting chip are stacked.

9. The semiconductor light-emitting device of claim 1, wherein the first-type electrode comprises nickel (Ni), platinum (Pt), silver (Ag), indium tin oxide (ITO) or their combination, and the second-type electrode comprises titanium (Ti), aluminum (Al), chromium (Cr), platinum (Pt), aurum (Au) or their combination.

10. The semiconductor light-emitting device of claim 1, wherein each of the light-emitting units comprises a plurality of light-emitting sub-units that are electrically coupled to each other in series, in parallel or in series-parallel combination.

11. The semiconductor light-emitting device of claim 1, wherein each of the light-emitting units comprises a plurality of light-emitting sub-units that are stacked.

12. The semiconductor light-emitting device of claim 10, wherein the light-emitting sub-unit comprises at least one sub-electrode.

13. The semiconductor light-emitting device of claim 12, wherein the tapped point comprises at least one of the at least one sub-electrode.

14. The semiconductor light-emitting device of claim 12, wherein two sub-electrodes of two adjacent light-emitting sub-units are electrically coupled to outside of the light-emitting chip, thereby resulting in the tapped point.

15. The semiconductor light-emitting device of claim 12, wherein two sub-electrodes of two adjacent light-emitting sub-units are electrically coupled to each other within the light-emitting chip, thereby resulting in the tapped point, and then connected to outside of the light-emitting chip by a metal line.

16. A semiconductor light-emitting device, comprising:
    a plurality of light-emitting chips electrically coupled to each in series, in parallel or in series-parallel combination;
    a first-type electrode electrically coupled to an external power source, the first-type electrode being disposed on at least one of the light-emitting chips;
    a second-type electrode disposed on at least another one of the light-emitting chips different from the at least one of the light-emitting chips on which the first-type electrode is disposed; and
    a tapped point disposed on at least one of the light-emitting chips or between two of the adjacent light-emitting chips, and the tapped point being configured for electrically coupling to an electronic component selected from the group consisting of an integrated circuit, a printed electronic component, and a passive component other than a light-emitting diode;

wherein the tapped point is disposed on at least another one of the light-emitting units different from the light-emitting units on which the first-type electrode and the second-type electrode are disposed; and wherein the second-type electrode is electrically coupled to the electronic component at a point that is different from another point at which the tapped point is electrically coupled to the electronic component.

17. The semiconductor light-emitting device of claim 1, wherein the electronic component is a capacitor.

18. The semiconductor light-emitting device of claim 16, wherein the electronic component is a capacitor.

* * * * *